(12) United States Patent
Lin et al.

(10) Patent No.: US 8,459,335 B2
(45) Date of Patent: Jun. 11, 2013

(54) HEAT SINK HAVING HEAT-DISSIPATING FINS OF LARGE AREA AND METHOD FOR MANUFACTURING THE SAME

(75) Inventors: Kuo-Len Lin, Wugu Township, Taipei County (TW); Chen-Hsiang Lin, Wugu Township, Taipei County (TW); Ken Hsu, Wugu Township, Taipei County (TW); Chih-Hung Cheng, Wugu Township, Taipei County (TW)

(73) Assignees: CPUmate Inc, New Taipei (TW); Golden Sun New Techniques Co., Ltd., New Taipei (TW)

( * ) Notice: Subject to any disclaimer, the term of this patent is extended or adjusted under 35 U.S.C. 154(b) by 655 days.

(21) Appl. No.: 12/511,202

(22) Filed: Jul. 29, 2009

(65) Prior Publication Data

US 2011/0024089 A1   Feb. 3, 2011

(51) Int. Cl.
*F28F 7/00*   (2006.01)

(52) U.S. Cl.
USPC .................. 165/80.3; 165/104.33; 361/700

(58) Field of Classification Search
USPC ........ 165/80.2, 80.3, 104.19, 104.21, 104.26, 165/104.33, 151, 181, 182, 185; 29/890.032, 29/890.04, 890.043; 361/697, 704, 710, 700
See application file for complete search history.

(56) References Cited

U.S. PATENT DOCUMENTS

| | | | | |
|---|---|---|---|---|
| 2,994,123 A * | 8/1961 | Kritzer | | 29/890.047 |
| 3,149,667 A | 9/1964 | Astrup | | |
| 3,241,610 A * | 3/1966 | Kritzer | | 165/182 |
| 4,067,384 A * | 1/1978 | Miyakawa | | 165/151 |
| 4,592,420 A | 6/1986 | Hughes | | |
| 5,732,768 A * | 3/1998 | Fraulo | | 165/151 |
| 5,896,917 A * | 4/1999 | Lemont et al. | | 165/80.3 |
| 7,298,621 B2 * | 11/2007 | Xia et al. | | 361/701 |
| 7,584,780 B1 * | 9/2009 | Lemont et al. | | 165/80.3 |
| 2003/0094273 A1 * | 5/2003 | Toth et al. | | 165/183 |
| 2008/0257527 A1 | 10/2008 | Li et al. | | |
| 2010/0218915 A1 * | 9/2010 | Chen | | 165/80.3 |
| 2011/0024087 A1 * | 2/2011 | Lin et al. | | 165/104.26 |
| 2011/0024088 A1 * | 2/2011 | Lin et al. | | 165/104.26 |

FOREIGN PATENT DOCUMENTS

| EP | 0 791 794 A1 | 8/1997 |
|---|---|---|
| FR | 1 602 080 | 11/1970 |

OTHER PUBLICATIONS

European search report dated Dec. 16, 2009.

* cited by examiner

*Primary Examiner* — Brandon M Rosati
*Assistant Examiner* — Orlando E Aviles Bosques
(74) *Attorney, Agent, or Firm* — Chun-Ming Shih; HDLS IPR Services (57) ABSTRACT

A heat-dissipating fin of a large area is made of a metallic sheet and has a fin body. An outer edge of one side of the fin body extends to form a sheet-like expanding portion. The expanding portion is bent and overlapped on the fin body to obtain the heat-dissipating fin. A heat sink includes a plurality of heat-dissipating fins and a heat-conducting element, which is formed by means of penetrating the respective heat-dissipating fins with a condensing section of the heat-conducting element.

12 Claims, 10 Drawing Sheets

HEAT SINK HAVING HEAT-DISSIPATING FINS OF LARGE AREA AND METHOD FOR MANUFACTURING THE SAME

BACKGROUND OF THE INVENTION

1. Field of the Invention

The present invention relates to a heat sink, and in particular to a heat-dissipating fin of a large area capable of increasing the total heat-dissipating area in a stack of heat-dissipating fins, a heat sink having such heat-dissipating fins, and a method for manufacturing the same.

2. Description of Prior Art

With the rapid advancement of the computer industry, the operating speed of electronic elements increases to a much larger extent, and thus the amount of heat generated by the electronic elements is increased accordingly. Therefore, in order to maintain the electronic elements to operate continuously at an admissible range of temperature. It is well known to use a heat sink to dissipate the heat generated by the electronic elements. The current heat sink is usually provided with a heat pipe, in which a heat-conducting substance is used to help the heat sink to dissipate the heat by means of the phase change between the liquid state and the vapor state of the heat-conducting substance. In addition, heat-dissipating fins penetrate a condensing end of the heat pipe also has have an influence on the total heat-dissipating efficiency.

In an aluminum-extruded heat sink, owing to the limitation in the conventional manufacturing process, the heat-dissipating fins must have a certain thickness and pitch, and these heat-dissipating fins are stacked up to form a heat sink. Since the heat-dissipating fin is thinner and the pitch between the respective heat-dissipating fins is small, the whole heat-dissipating area of the heat sink can be increased substantially, and thus the heat-dissipating efficiency can be improved. However, in order to further increase the area of the fins in the heat sink, manufacturers in this field attempt to increase the dimension of each heat-dissipating fin to thereby increase the total heat-dissipating area. Further, the heat-dissipating fin can be made waved to increase the heat-dissipating area. Although the above-mentioned solutions can increase the heat-dissipating area of the heat sink, the increase is so limited and the volume of the whole heat sink may be adversely increased.

Therefore, in order to solve the above-mentioned problems, the present Inventor proposes a reasonable and novel structure based on his deliberate research and expert experiences.

SUMMARY OF THE INVENTION

The present invention is to provide a heat-dissipating fin of a large area, a heat sink having such heat-dissipating fins, and a method for manufacturing the same. Without increasing the volume of the heat-dissipating fin significantly, the area of the heat-dissipating fins can be increased substantially by means of bending and overlapping the heat-dissipating fins. Then, the plurality of heat-dissipating fins can be used to form a heat sink. Thus, the heat-dissipating efficiency of the heat-dissipating fins or the heat sink can be increased.

The present invention is to provide a heat-dissipating fin of a large area, which has a fin body. An outer edge of one side of the fin body extends to form a sheet-like expanding portion. The expanding portion is bent and overlapped on the fin body.

The present invention provides a heat sink having heat-dissipating fins of a large area, which includes a plurality of heat-dissipating fins and a heat-conducting element having a heat-absorbing section and a condensing section. Each of the heat-dissipating fins has a fin body. An outer edge of one side of the fin body extends to form a sheet-like expanding portion. The expanding portion is bent and overlapped on the fin body. Each of the heat-dissipating fins is provided with corresponding through-holes. The condensing section of the heat-conducting element penetrates the through-hole of each heat-dissipating fin. In this way, the heat-dissipating fins can be overlapped on the condensing section of the heat-conducting element.

The present invention provides a method for manufacturing a heat sink having heat-dissipating fins of a large area, which includes the steps of:

a) preparing a heat-conducting element and a plurality of heat-dissipating fins, the heat-conducting element having a heat-absorbing section and a condensing section, each of the heat-dissipating fins having a fin body, an outer edge of one side of the fin body extending to form a sheet-like expanding portion;

b) bending and overlapping the expanding portion of each heat-dissipating fin toward the fin body;

c) punching through-holes on the respective heat-dissipating fins; and d) penetrating the through-holes of the respective heat-dissipating fins by the condensing section of the heat-conducting element.

DETAILED DESCRIPTION OF THE INVENTION

In order to make the Examiner further understand the characteristics and technical contents of the present invention, a detailed description will be made with reference to the accompanying drawings. However, the drawings are illustrative only but not used to limit the present invention.

Figure 1:
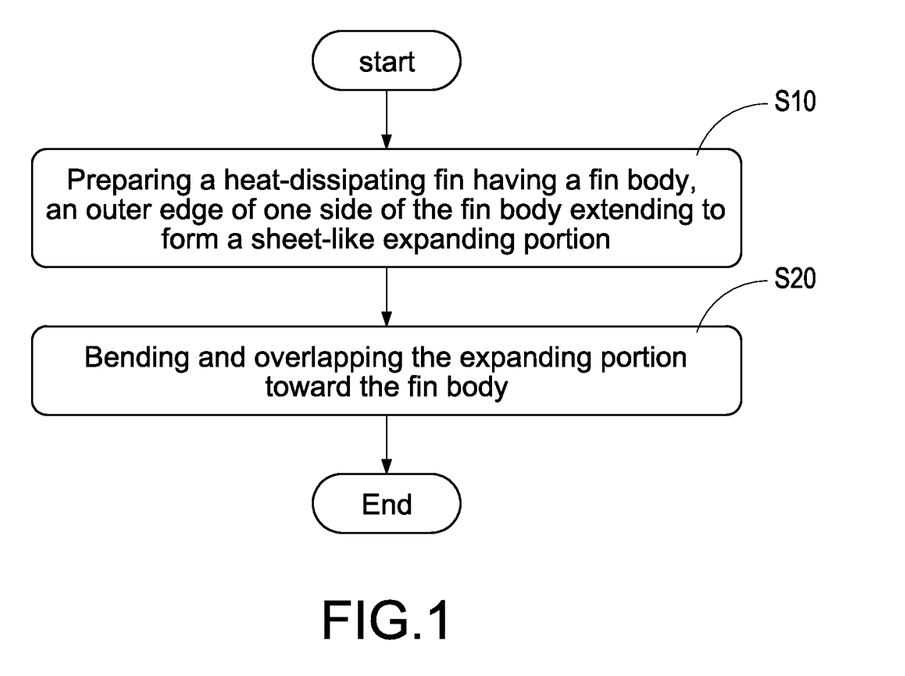
FIG. 1 is a flow chart showing the process for manufacturing the heat-dissipating fin according to the present invention.
Figure 2:
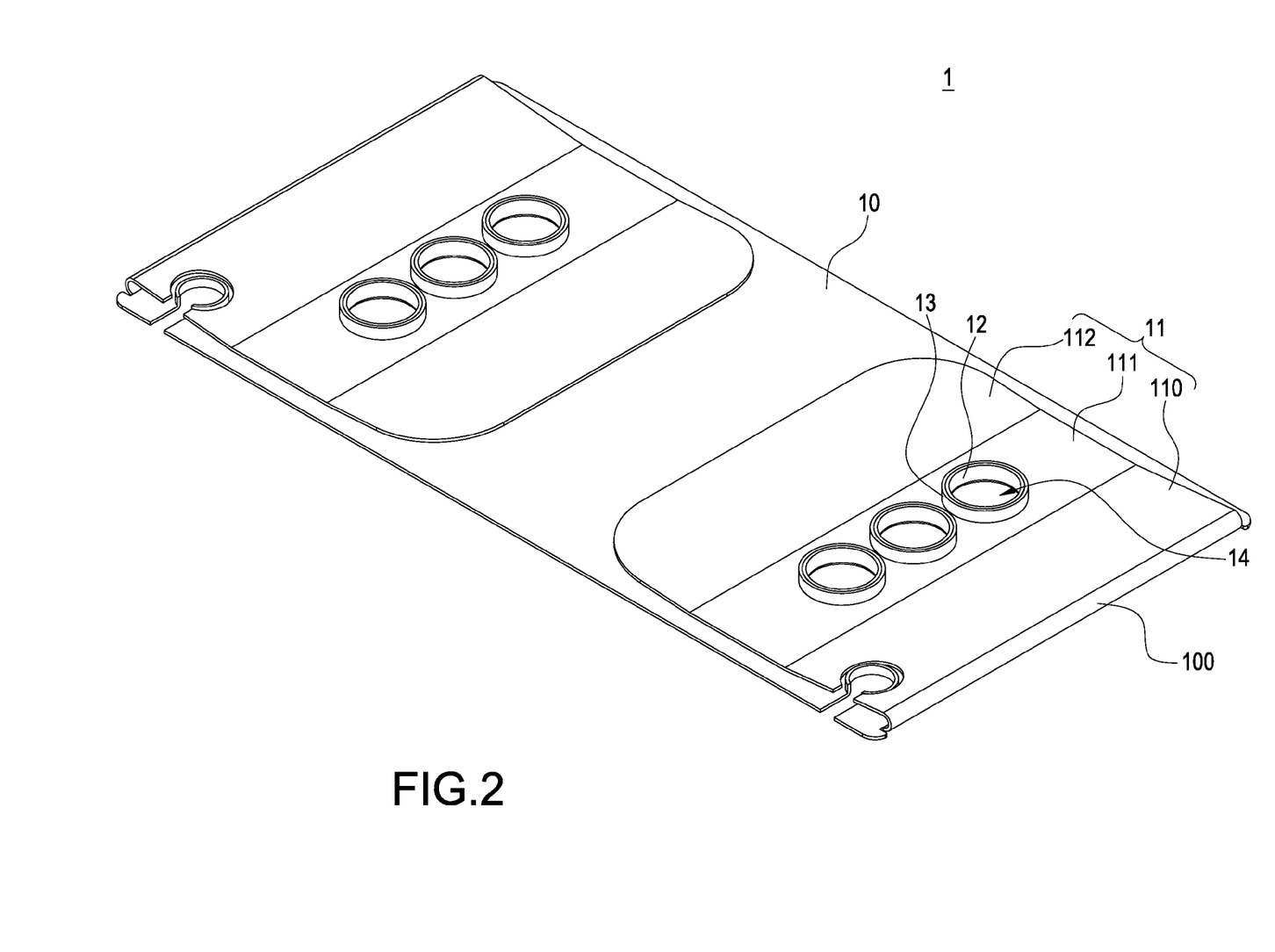
FIG. 2 is a view showing the external appearance of the heat-dissipating fin according to a first embodiment of the present invention.

The present invention provides a heat-dissipating fin of a large area. Please refer to FIGS. 1 and 2. FIG. 1 is a flow chart showing the process for manufacturing the heat-dissipating fin according to the present invention, and FIG. 2 is a view showing the external appearance of the heat-dissipating fin according to a first embodiment of the present invention. The heat-dissipating fin 1 has a fin body 10 made of metallic materials of good heat-dissipating property. An outer edge of one side of the fin body 10 extends to form a sheet-like expanding portion 11. The outer edge has a first width, the sheet-like expanding portion connecting at the outer edge has a second width, and the second width is smaller than the first width so that a protrusion 101 is formed at each of two corners of the outer edge. The expanding portion 11 is used to increase the heat-dissipating area of the heat-dissipating fin 1. The expanding portion 11 is bent and overlapped on the fin body 10. Thus, in this way, without increasing the volume of the heat-dissipating fin 1, the total heat-dissipating area can be increased.

Figure 3:
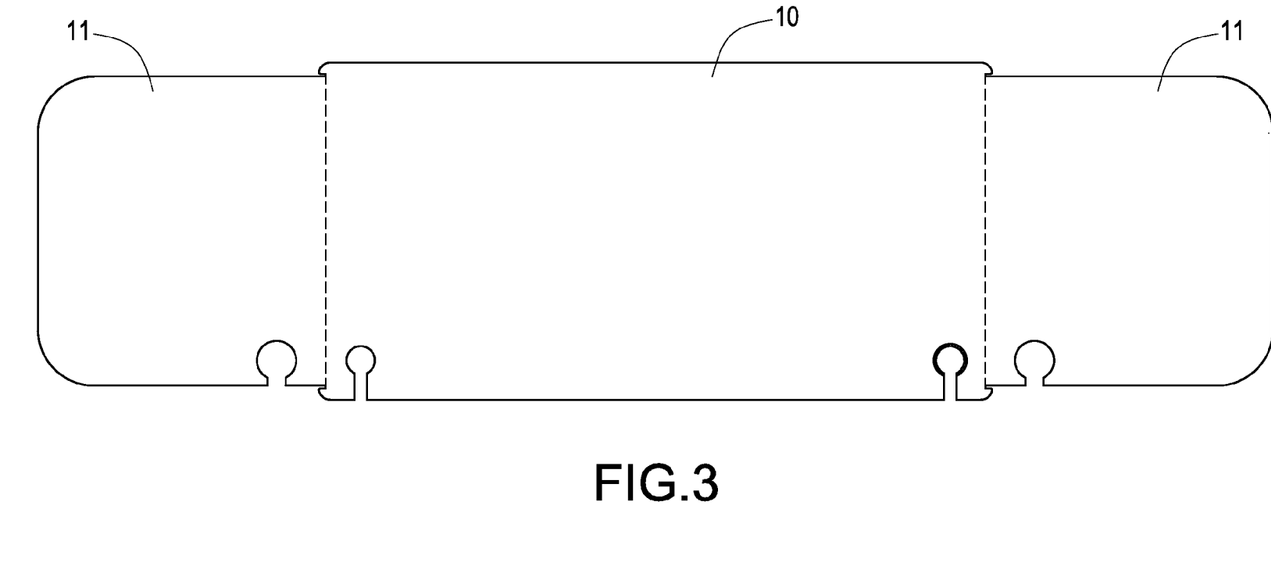
FIG. 3 is an exploded view of the heat-dissipating fin according to the first embodiment of the present invention.

Please refer to FIGS. 1 and 3. In a step S10, first, a metallic sheet of good heat-dissipating property is prepared, by means of which the heat-dissipating 1 can be made. The metallic sheet is made flat and expanded (as shown in FIG. 3) by means of a press-forming process, thereby forming the fin body 10. At least an outer edge of one side of the fin body 10 extends to form a sheet-like expanding portion 11.

Figure 4:
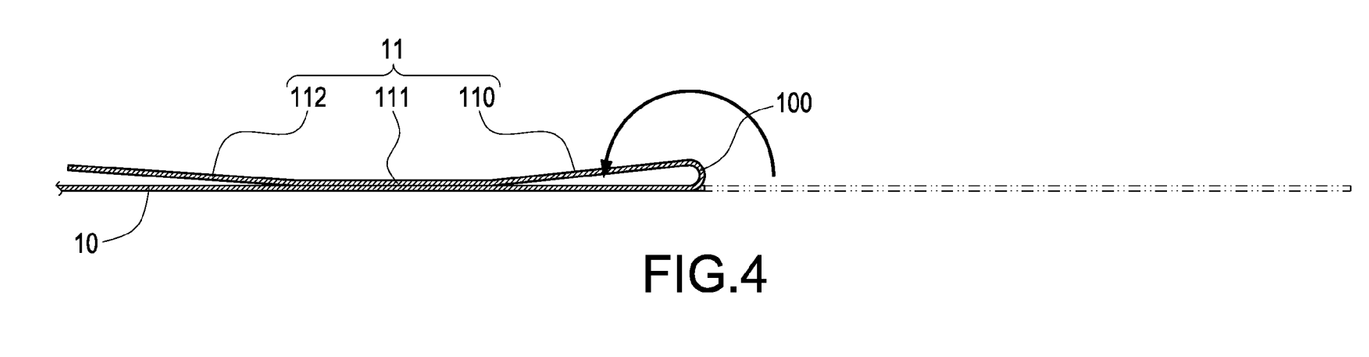
FIG. 4 is a view showing the action for bending the heat-dissipating fin according to the first embodiment of the present invention.

Please refer to FIGS. 1 and 4. In a step S20, the expanding portion 11 is bent toward the fin body 10, so that the expanding portion 11 is overlapped on the fin body 10. In this step, a curved section 100 bent reversely is integrally formed between the fin body 10 and the expanding portion 11, so that a gap is formed between the fin body 10 and the expanding portion 11 and thus the total area of both surfaces of the expanding portion 11 can be used for heat dissipation. In the present embodiment, the expanding portion 11 comprises a first extending section 110, a perforated section 111 and a second extending section 112. The first extending section 110 extends from the outer edge of one side of the fin body 10. A curved section 100 is integrally connected to the fin body 10. A gap is formed between the first extending section 110 of the expanding portion 11 and the fin body 10.

Figure 5:
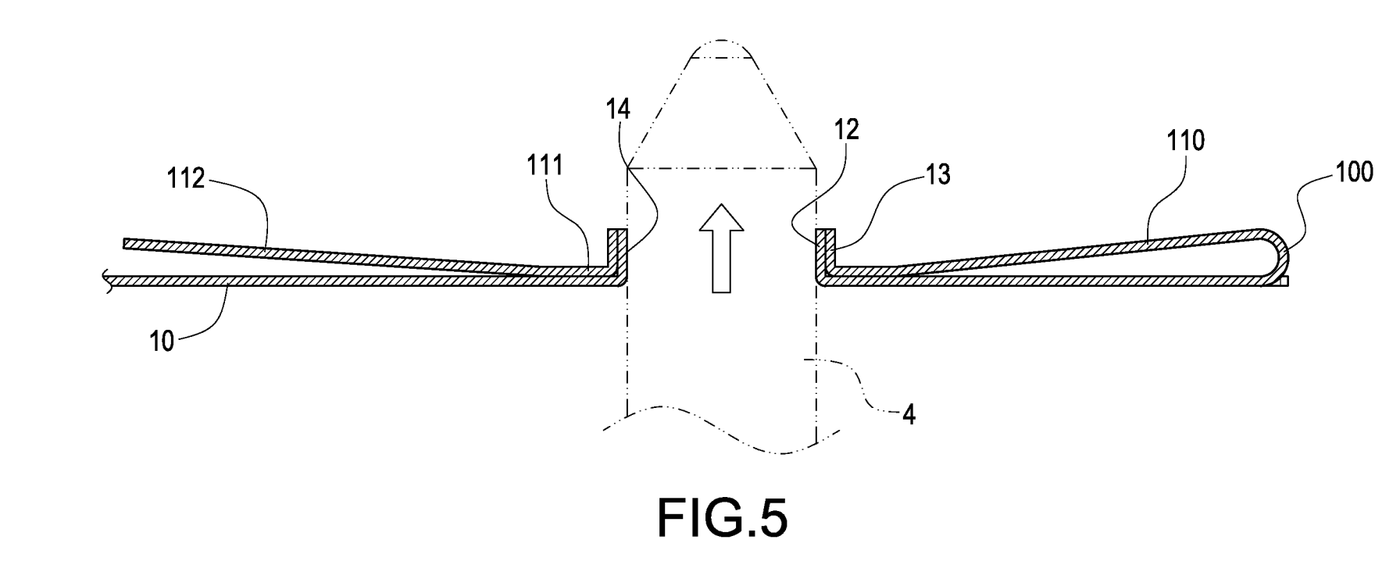
FIG. 5 is a view showing the action for punching the heat-dissipating fin according to the first embodiment of the present invention.

The perforated section 111 of the expanding portion 11 is formed by extending from the distal edge of the first extending section 110, so that it can be perforated. As shown in FIG. 5, by means of a perforating punch 4, through-holes 14 can be made on the fin body 10 corresponding to the perforated section 111. In the present embodiment, the perforating punch 4 penetrates into the fin body 4 to form respectively an outer annular wall 13 on the perforated section 111 and an inner annular wall 12 on the fin body 10 to be located inside the outer annular wall 13. Inside the inner annular wall 12 and the outer annular wall 13, a through-hole 14 is formed for allowing a heat-conducting element (later described) to penetrate therein. On the contrary, the perforating punch 4 can penetrates into the perforated section 111, so that the inner annular wall 12 can be formed on the perforated section 111 and the outer annular wall 13 can be formed on the fin body 10. In this way, a through-hole 14 identical to the previous one can be also formed.

The second extending section 112 of the expanding portion 11 is formed by extending from the distal edge of the perforated section 111, thereby increasing the heat-dissipating area of the heat-dissipating fin 1. The second extending section 112 is inclined upwards from the fin body 10 without contacting the fin body 10. With this arrangement, the second extending section 112 can have a larger surface area to contact with air for better heat dissipation.

In the present embodiment, the outer edges of both sides of the fin body 10 can be extended to form an expanding portion 11 respectively. The extended length of the expanding portion 11 can be smaller than half of the fin body 10. Alternatively, in the previous case that only one side of the fin body 10 is provided with the expanding portion 11, the extended length of the expanding portion 11 is smaller than that of the fin body 10.

Figure 6:
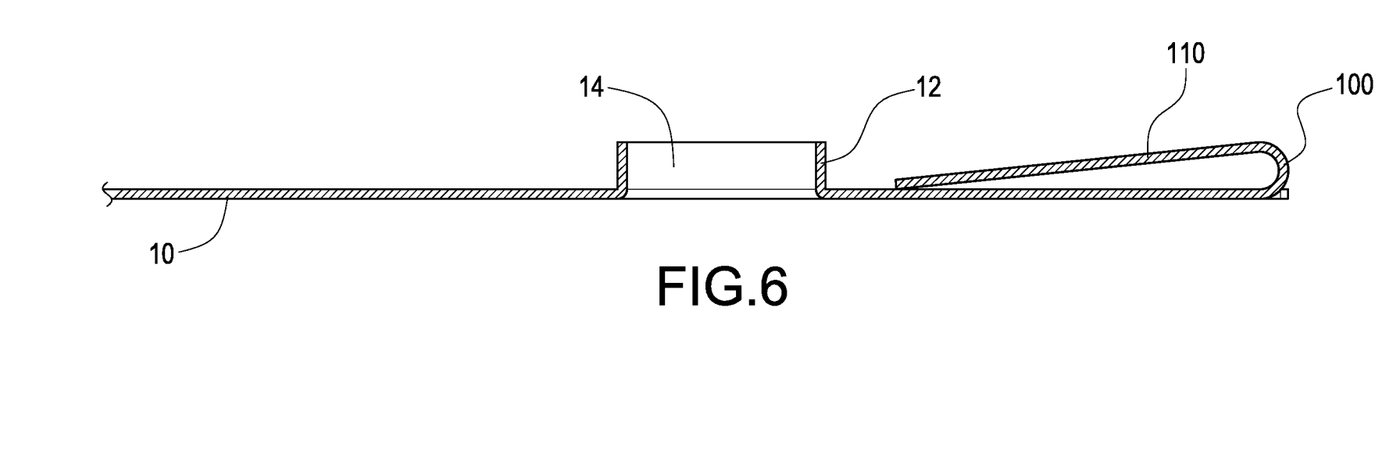
FIG. 6 is a partially cross-sectional view showing the heat-dissipating fins according to the second embodiment of the present invention.

Further, please refer to FIG. 6, which is a partially cross-sectional view showing the second embodiment of the heat-dissipating fins of the present invention. Under the circumstance that the expanding portion 11 of the heat-dissipating fin 1 has only one first extending section 110, the fin body 10 is provided with the inner annular wall 12 and the through-hole 14. The present embodiment also allows a heat-conducting element (later described) to penetrate therein.

Figure 7:
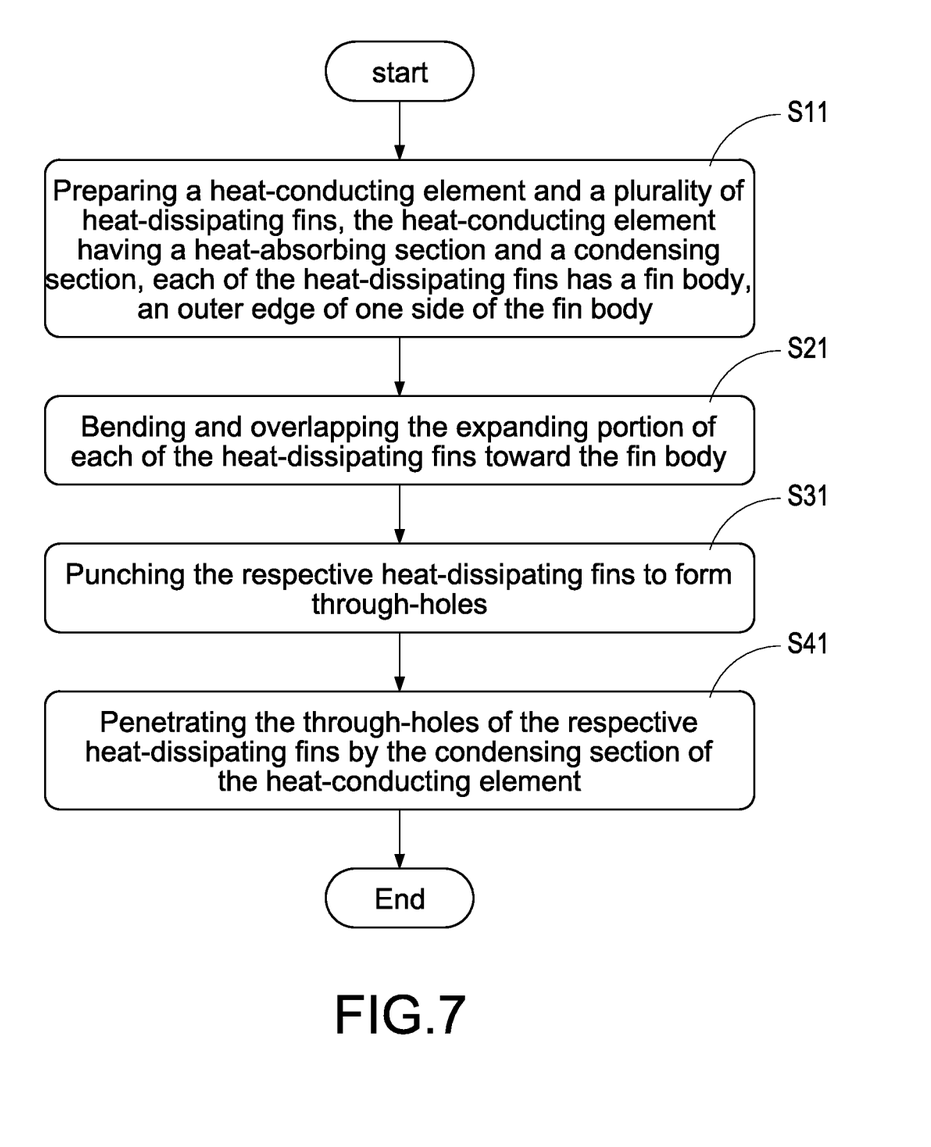
FIG. 7 is a flow chart showing the process for manufacturing the heat sink of the present invention.
Figure 8:
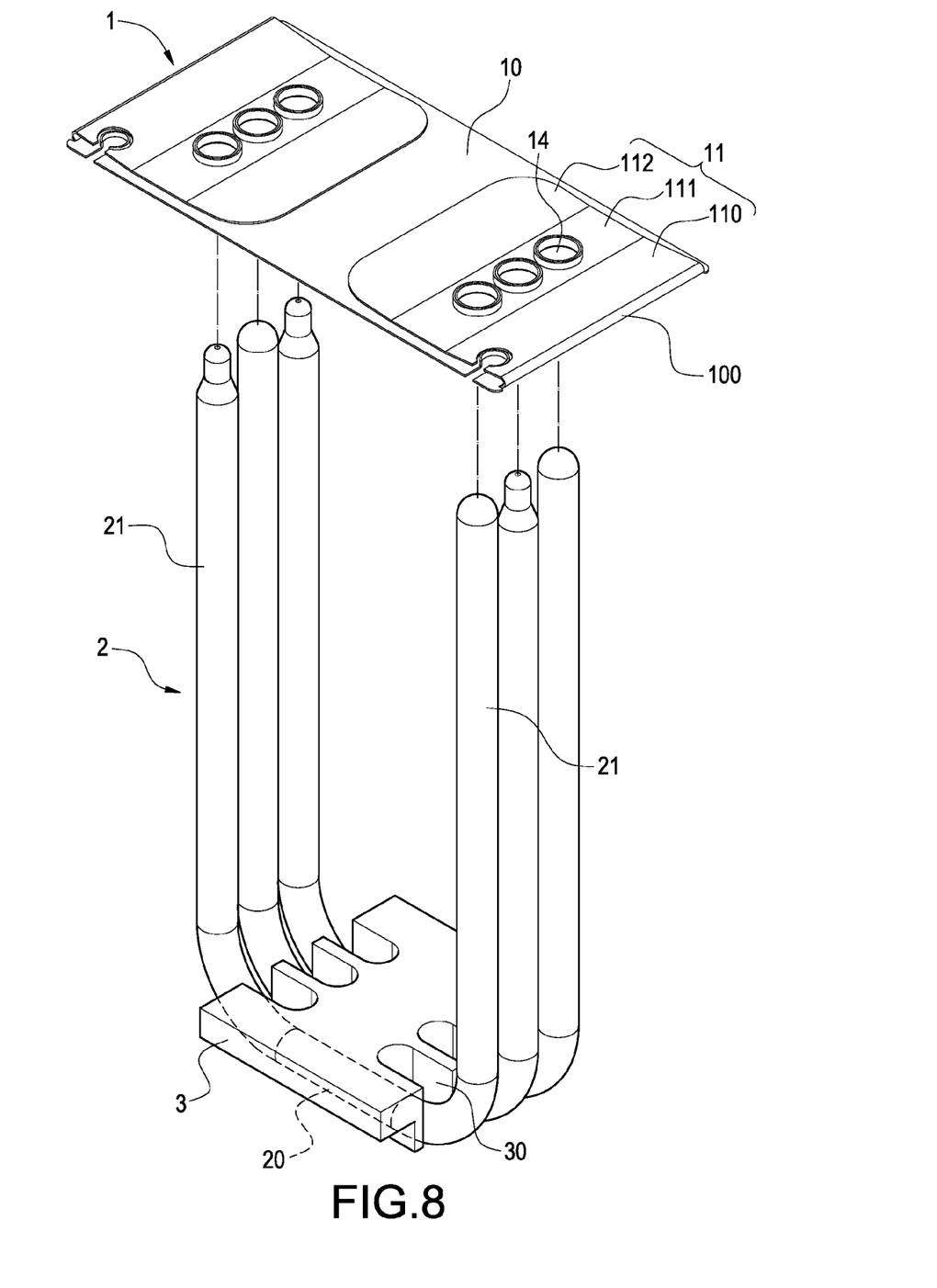
FIG. 8 is an exploded perspective view showing the heat sink according to the first embodiment of the present embodiment.
Figure 9:
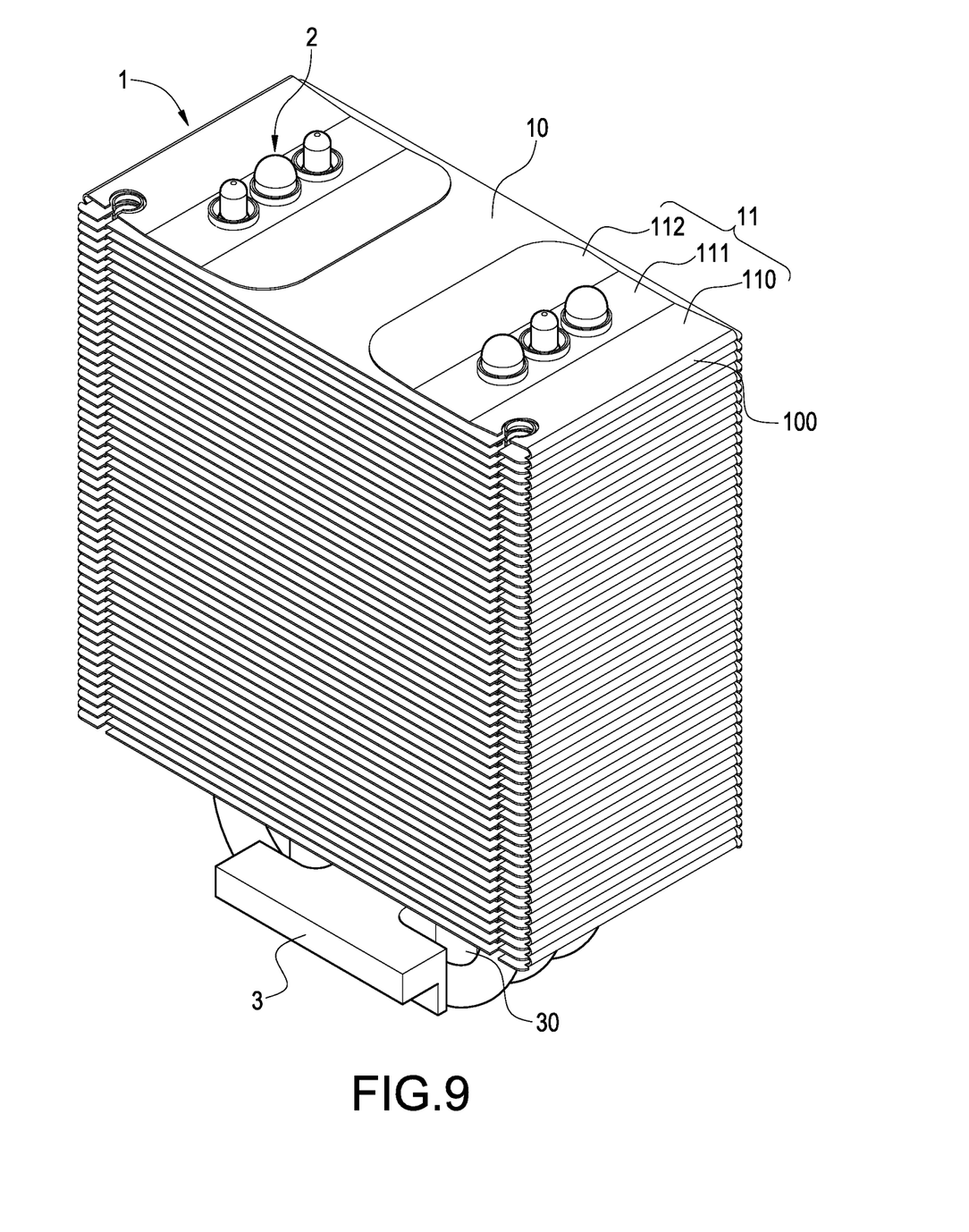
FIG. 9 is an assembled perspective view showing the heat sink according to the first embodiment of the present embodiment.

In addition, the present invention also provides a heat sink having such heat-dissipating fins and a method for manufacturing the same. Please refer to FIGS. 7 to 9. FIG. 7 is a flow chart showing the process for manufacturing the heat sink of the present invention. FIG. 8 and FIG. 9 are an exploded perspective view and an assembled perspective view showing the heat sink according to the first embodiment of the present embodiment respectively. The heat sink includes a plurality of heat-dissipating fins 1 and at least one heat-conducting element 2. The heat-conducting element 2 penetrates the through-holes 14 of the respective heat-dissipating fins 1, thereby forming a heat sink having the heat-dissipating fins. Without increasing the volume occupied by the respective heat-dissipating fins significantly, the total heat-dissipating area can be increased.

Please refer to FIGS. 7 and 4. In a step S11, first, at least one heat-conducting element 2 and the plurality of heat-dissipating fins 1 are prepared. Since the heat-dissipating fins 1 have been described in the above paragraphs, the description thereof is omitted for clarity. The heat-conducting element 2 may be a heat pipe or a vapor chamber, which is formed to have a heat-absorbing section 20 and at least one condensing section 21. In the present embodiment, the heat-conducting element 2 is a heat pipe, which is formed into U shape. The bottom section of the U-shaped heat pipe is configured as the heat-absorbing section 21, while both ends of the U-shaped heat pipe are configured as the condensing sections 21 respectively.

Please refer to FIGS. 7 and 4. In a step S21, the expanding portion 11 of each heat-dissipating fin 1 is bent toward the fin body 10, so that the expanding portion 11 of each heat-dissipating fin 1 can be overlapped on the fin body 10. Since this step is the same as that in the process for manufacturing the heat-dissipating fins 1, the only difference is to make a plurality of heat-dissipating fins in this step. Thus, the description relating thereto is omitted for clarity.

Please refer to FIGS. 7 and 5. In a step S31, the thus-formed heat-dissipating fins 1 are punched to form through-holes 14 respectively. The through-holes 14 on the respective heat-dissipating fins 1 correspond to each other. The description of this step is the same as that in the above.

Figure 10:
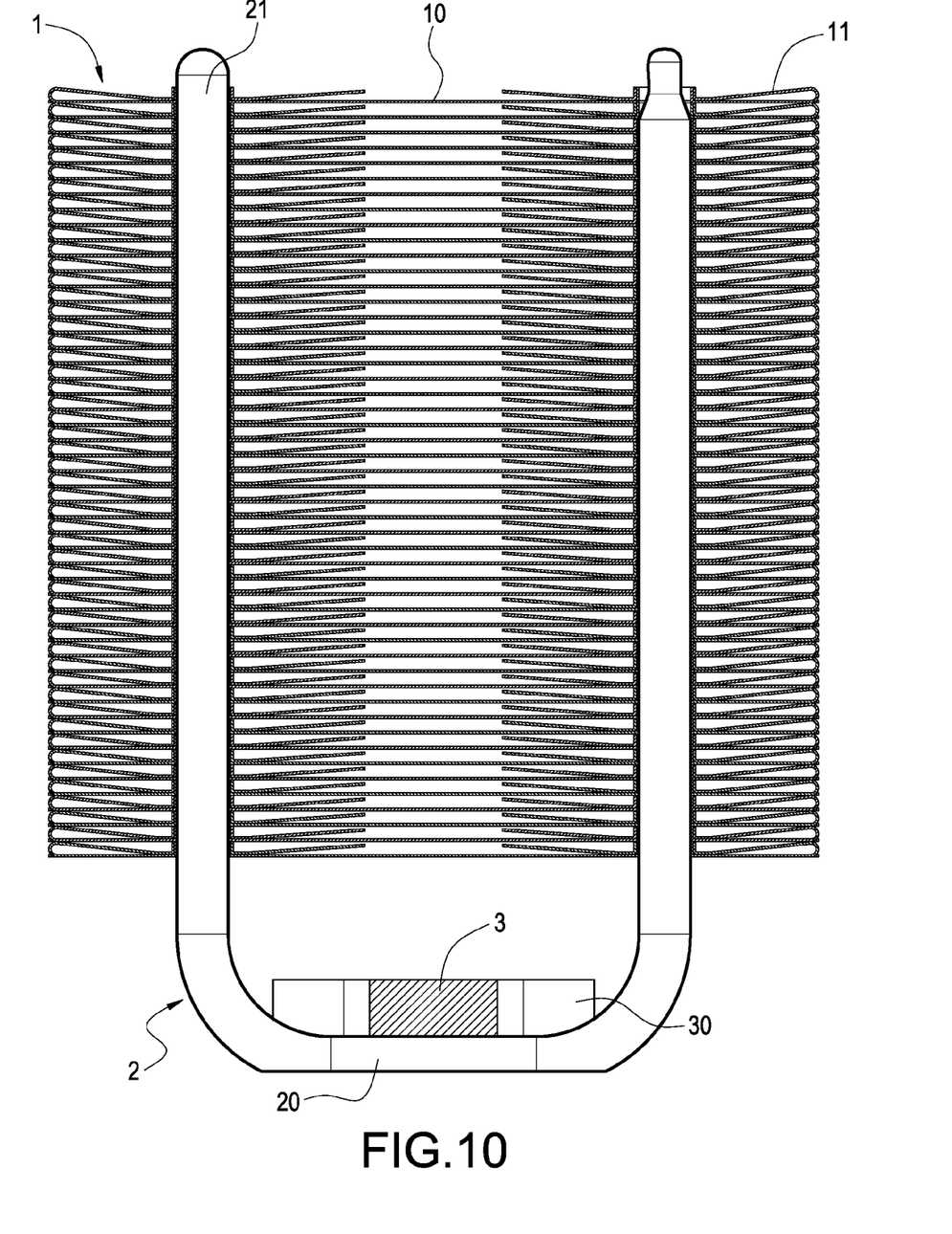
FIG. 10 is a cross-sectional view showing the heat sink according to the first embodiment of the present embodiment.

Please refer to FIGS. 7 and 8. In a step S41, the condensing section 21 of the heat-conducting element 2 penetrates the through-holes 14 of the respective heat-dissipating fins 1, thereby forming a heat sink (as shown in FIG. 9) having a stack of heat-dissipating fins. Please refer to FIGS. 8 to 10, in order to bring the heat-absorbing section 20 of the heat-conducting element 2 into surface contact with a heat-generating source (not shown) more easily, the heat sink further comprises a base 3. The base 3 is provided on the heat-absorbing section 20 of the heat-conducting element 2 to be thermally connected thereto. The bottom surface of the base 3 is provided with a groove 30 for allowing the heat-absorbing section 20 of the heat-conducting element 2 to be embedded therein. The heat-absorbing section 20 of the heat-conducting element 2 can be also emerged from the bottom surface of the base 3, thereby contacting a heat-generating source (not shown) directly.

Figure 11:
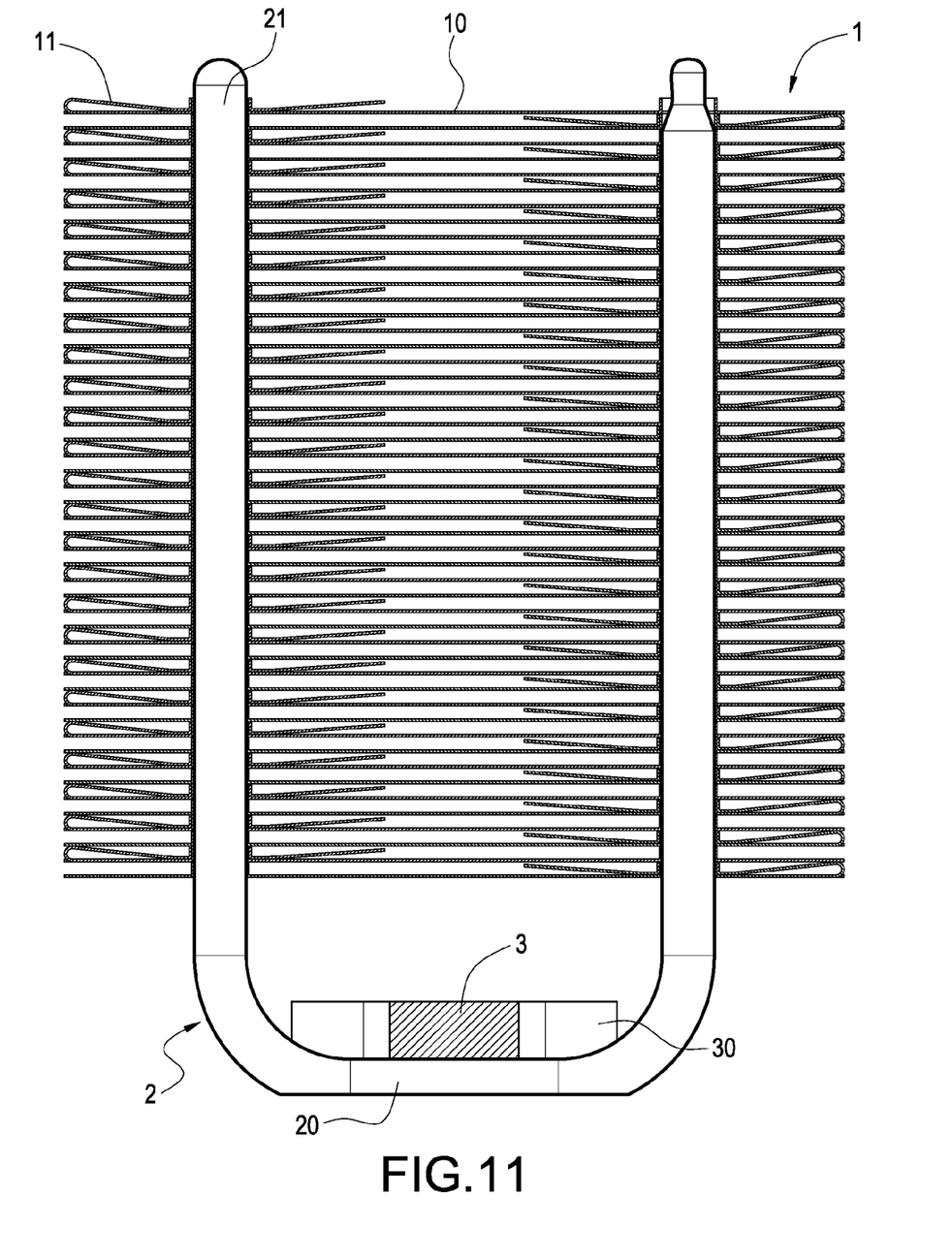
FIG. 11 is a cross-sectional view showing the heat sink according to the second embodiment of the present embodiment.

Please refer to FIG. 11, which is a cross-sectional view showing the heat sink according to the second embodiment of the present invention. If only one side of each of the heat-dissipating fins 1 is provided with the expanding portion 11, the heat-dissipating fins 1 can be arranged in a staggered manner, thereby facilitating to overlap these heat-dissipating fins 1.

Figure 12:
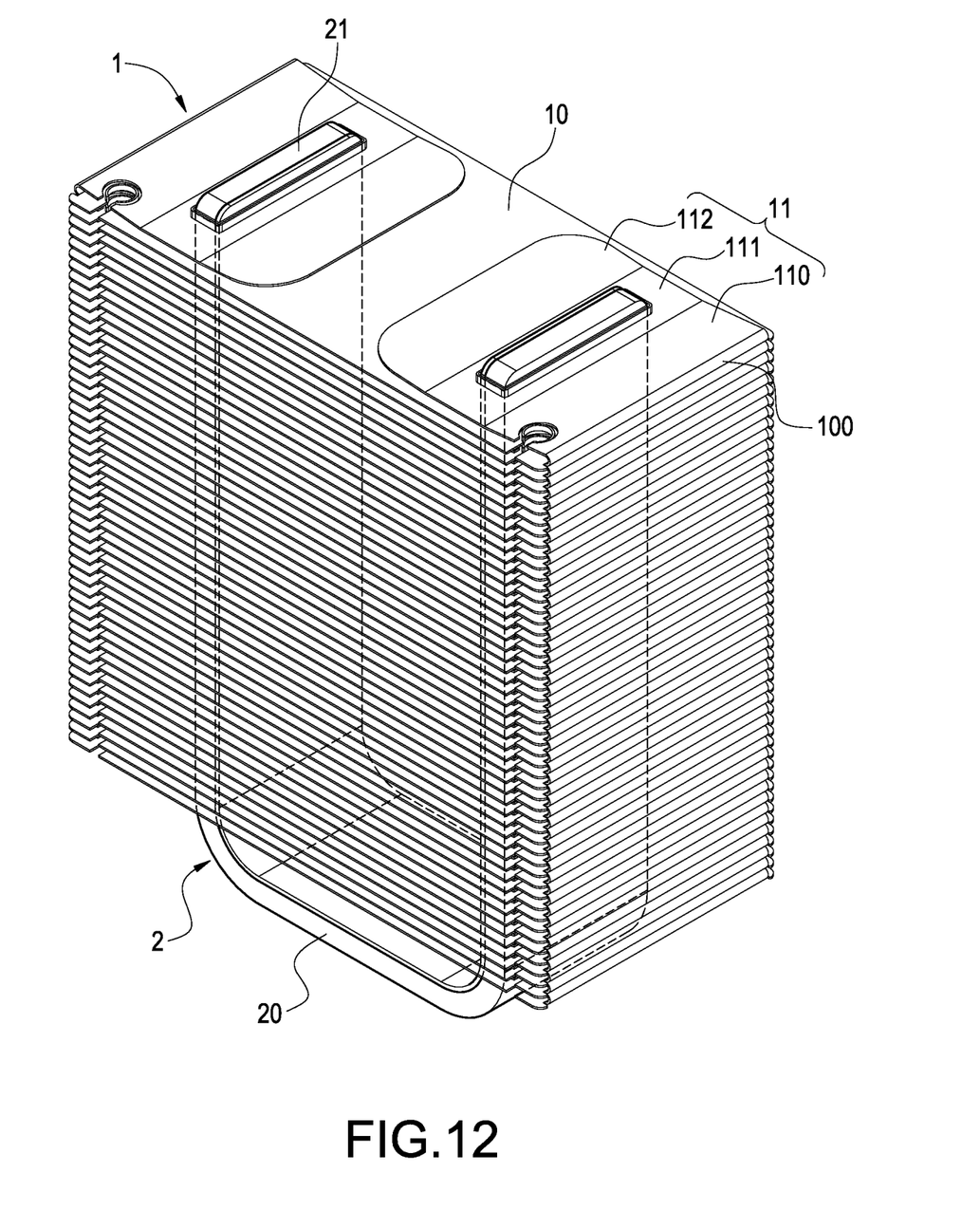
FIG. 12 is a cross-sectional view showing the heat sink according to the third embodiment of the present embodiment.

Please refer to FIG. 12, which is a cross-sectional view showing the heat sink according to the third embodiment of the present invention. The heat-conducting element 2 is a vapor chamber that cooperates with the through-holes 14. The other structural characteristics are the same as those in the previous embodiments.

According to the above, the present invention really achieve the desire objects and solves the problems of prior art. Further, the present invention demonstrates industrial applicability, novelty and inventive steps and thus conforms to the requirements for an invention patent.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A heat-dissipating fin of a large area having a fin body, an outer edge of one side of the fin body extending to form a sheet-like expanding portion, wherein the outer edge has a first width, the sheet-like expanding portion connecting at the outer edge has a second width, and the second width is smaller than the first width so that a protrusion is formed at each of two corners of the outer edge, the expanding portion being bent and overlapped on the fin body,
   wherein the expanding portion has a first extending section, a curved section is integrally connected between the fin body and the first extending section, and a gap is formed between the fin body and the first extending section,
   wherein the expanding portion further extends from a distal edge of the first extending section to form a perforated section, and the perforated section is adhered to the fin body, and
   wherein the expanding portion further extends from a distal edge of the perforated section to form a second extending section, the second extending section is inclined upwards from the fin body.

2. The heat-dissipating fin of a large area according to claim 1, wherein the perforated section is provided with an outer annular wall, the fin body is provided with an inner annular wall located inside the outer annular wall, a through-hole is formed in the inner annular wall and the outer annular wall.

3. The heat-dissipating fin of a large area according to claim 1, wherein an outer edge of the other side of the fin body also extends to form a sheet-like expanding portion, the other expanding portion is also bent and overlapped on the fin body.

4. The heat-dissipating fin of a large area according to claim 3, wherein a length formed by extending from the two expanding portions is smaller than half of the fin body.

5. A heat sink having heat-dissipating fins of a large area, comprising:
   a plurality of heat-dissipating fins each having a fin body, an outer edge of one side of the fin body extending to form a sheet-like expanding portion, wherein the outer edge has a first width, the sheet-like expanding portion connecting at the outer edge has a second width, and the second width is smaller than the first width so that a protrusion is formed at each of two corners of the outer edge, the expanding portion being bent and overlapped on the fin body; and
   a heat-conducting element having a heat-absorbing section and a condensing section;
   wherein each of the heat-dissipating fins is provided with corresponding through-holes, the condensing section of the heat-conducting element penetrates the through-hole of each heat-dissipating fin to thereby overlap the heat-dissipating fins on the condensing section of the heat-conducting element,
   wherein the expanding portion of each of the heat-dissipating fins has a first extending section, a curved section is integrally connected between the fin body and the first extending section, and a gap is formed between the fin body and the first expending section,
   wherein the expanding portion of each of the heat-dissipating fins further extends from a distal edge of the first extending section to form a perforated section, the perforated section is adhered to the fin body, and the through-hole is located on the fin body corresponding to the perforated section, and
   wherein the expanding portion of each of the heat-dissipating fins further extends from a distal edge of the perforated section to form a second extending section, the second extending section is inclined upwards from the fin body.

6. The heat sink having heat-dissipating fins of a large area according to claim 5, wherein the perforated section is provided with an outer annular wall, the fin body is provided with an inner annular wall located inside the outer annular wall, the through-hole is formed in the inner annular wall and the outer annular wall.

7. The heat sink having heat-dissipating fins a large area according to claim 5, wherein the heat-dissipating fins are arranged in a staggered manner.

8. The heat sink having heat-dissipating fins of a large area according to claim 5, wherein an outer edge of the other side of the fin body of each of the heat-dissipating fins also extends to form a sheet-like expanding portion, the other expanding portion is also bent and overlapped on the fin body.

9. The heat sink having heat-dissipating fins of a large area according to claim 8, wherein a length formed by extending from the two expanding portions is smaller than half of the fin body.

10. The heat sink having heat-dissipating fins of a large area according to claim 5, wherein the heat-conducting element is a heat pipe or vapor chamber.

11. The heat sink having heat-dissipating fins of a large area according to claim 5, further comprising a base, the base being provided on the heat-absorbing section of the heat-conducting element.

12. The heat sink having heat-dissipating fins of a large area according to claim 11, wherein a bottom surface of the base is provided with a groove, the heat-absorbing section of the heat-conducting element is embedded into the groove.

* * * * *